(12) United States Patent
Åkesson et al.

(10) Patent No.: US 7,767,319 B2
(45) Date of Patent: Aug. 3, 2010

(54) INSERT

(75) Inventors: Leif Åkesson, Älvsjö (SE); Toril Myrtveit, Kungsängen (SE); Ibrahim Sadik, Kista (SE)

(73) Assignee: Sandvik Intellectual Property AB, Sandviken (SE)

( * ) Notice: Subject to any disclaimer, the term of this patent is extended or adjusted under 35 U.S.C. 154(b) by 434 days.

(21) Appl. No.: 11/802,569

(22) Filed: May 23, 2007

(65) Prior Publication Data
US 2007/0292671 A1 Dec. 20, 2007

(30) Foreign Application Priority Data
Jun. 15, 2006 (SE) .................................... 0601312

(51) Int. Cl.
*B32B 9/00* (2006.01)
*C23C 14/06* (2006.01)

(52) U.S. Cl. ........................... 428/697; 51/307; 51/309; 204/192.38; 428/336; 428/698; 428/699

(58) Field of Classification Search ................... 51/307, 51/309; 428/336, 472, 697, 698, 699; 204/192.38
See application file for complete search history.

(56) References Cited

U.S. PATENT DOCUMENTS

| | | | |
|---|---|---|---|
| 5,656,383 A * | 8/1997 | Tanaka et al. | ............... 428/697 |
| 5,912,051 A | 6/1999 | Olsson et al. | |
| 5,942,318 A | 8/1999 | Soderberg et al. | |
| 6,062,776 A | 5/2000 | Sandman et al. | |
| 6,177,178 B1 | 1/2001 | Östlund et al. | |
| 6,250,855 B1 * | 6/2001 | Persson et al. | ................. 51/309 |
| 6,326,093 B1 * | 12/2001 | Lindholm et al. | ............ 428/699 |
| 6,342,291 B1 * | 1/2002 | Jonsson et al. | .............. 428/697 |
| 6,638,609 B2 | 10/2003 | Nordgren et al. | |
| 6,767,583 B2 | 7/2004 | Nordgren et al. | |
| 7,431,542 B2 * | 10/2008 | Hessman, Ingemar | ...... 428/698 |
| 2003/0175536 A1 * | 9/2003 | Penich et al. | ................ 428/698 |
| 2006/0115683 A1 | 6/2006 | Hessman | |
| 2008/0276544 A1 * | 11/2008 | Hirose et al. | ................... 51/307 |

FOREIGN PATENT DOCUMENTS

| | | |
|---|---|---|
| WO | 01/16388 | 3/2001 |
| WO | 2006/043421 | 4/2006 |

* cited by examiner

*Primary Examiner*—Archene Turner
(74) *Attorney, Agent, or Firm*—Drinker Biddle & Reath LLP

(57) ABSTRACT

The present invention relates to a coated cemented carbide milling insert for either wet or dry machining of cast iron such as nodular cast iron (NCI), grey cast iron (GCI), austempered ductile iron (ADI) and compacted graphite iron (CGI) where a high wear resistance and an excellent resistance against thermo cracks are required comprising:

a substrate comprising from about 5 to about 7 wt-% Co, from about 140 to about 250 ppm Ti+Ta and balance WC with a weight ratio Ti/Ta of from about 0.8 to about 1.3 and a PVD-layer consisting of $Al_xTi_{1-x}N$, with x=from about 0.50 to about 0.70 and with a thickness of from about 1 to about 10 μm. The invention also relates to a method for making cutting tool inserts and their use.

15 Claims, No Drawings

INSERT

BACKGROUND OF THE INVENTION

The present invention pertains to a coated cemented carbide milling insert, particularly useful for either wet or dry machining of cast iron, such as nodular cast iron (NCI), grey cast iron (GCI), austempered ductile iron (ADI) and compacted graphite iron (CGI), where a high wear resistance and an excellent resistance against thermo cracks are required.

Cast irons have a machinability that can vary considerably between the various groups but also within a certain group. The tool life may be influenced significantly by a small variation in the chemical composition and/or the microstructure within the material. These variations may be related to the casting technique used, such as the cooling conditions. Cast irons are frequently machined with coated cemented carbide inserts using some kind of coolant, and the associated thermal cycling when the insert enters and exits the work piece, normally generates thermally induced cracks in the cutting edge perpendicular to the edge line, so called comb cracks. These comb cracks grows into the substrate and eventually cause chipping and deterioration of the cutting edge.

Cast irons are also very demanding when it comes to wear resistance due to non-metallic inclusions and/or cast skin, and therefore CVD-coated inserts have been commonly used, e.g. according to U.S. Pat. Nos. 5,912,051, 5,942,318, 6,767,583.

WO 2006/043421 discloses cemented carbides which include WC having an average particle diameter of 0.3 μm or less as a hard phase and 5.5 to 15 wt-% of at least one iron group metal element as a binder phase, and comprise, in addition to the above hard phase and binding phase, 0.005 to 0.06 wt-% of Ti, Cr in a weight ratio relative to the binder phase of 0.04 to 0.2, and the balanced amount of inevitable impurities. Especially, the cemented carbides contain no Ta.

U.S. Pat. No. 5,912,051 discloses a coated cutting insert particularly useful for dry milling of grey cast iron.

In U.S. Pat. No. 6,062,776 is disclosed a coated cemented carbide cutting tool particularly designed for the wet and dry milling of workpieces of low and medium alloyed steels or stainless steels, with or without abrasive surface zones, in machining operations requiring a high degree of toughness of the carbide cutting edge. The external cutting conditions are characterized by complex shapes of the workpiece, vibrations, chip hammering, recutting of the chips etc.

In U.S. Pat. No. 6,177,178 is disclosed a coated cemented carbide cutting tool particularly designed for the wet and dry milling of low and medium alloyed steels.

WO 01/16388 discloses a coated insert particularly useful for milling in low and medium alloyed steels with or without abrasive surface zones during dry or wet conditions at high cutting speed, and milling hardened steels at high cutting speed.

U.S. Pat. No. 6,638,609 discloses coated milling inserts particularly useful for milling of grey cast iron with or without cast skin under wet conditions at low and moderate cutting speeds and milling of nodular cast iron and compacted graphite iron with or without cast skin under wet conditions at moderate cutting speeds.

US Patent Application 2006/0115683 discloses coated milling inserts particularly useful for milling of grey cast iron with or without cast skin under dry conditions at preferably rather high cutting speeds and milling of nodular cast iron and compacted graphite iron with or without cast skin under dry conditions at rather high cutting speeds. The inserts are characterised by a WC—Co cemented carbide with a low content of cubic carbides and a highly W-alloyed binder phase and a coating including an inner layer of $TiC_xN_y$ with columnar grains followed by a wet blasted layer of $\alpha$-$Al_2O_3$.

OBJECTS AND SUMMARY OF THE INVENTION

It is the object of present invention to provide coated cemented carbide milling inserts, particularly useful for either wet or dry machining of cast iron, such as nodular cast iron (NCI), grey cast iron (GCI), austempered ductile iron (ADI) and compacted graphite iron (CGI), where a high wear resistance and an excellent resistance against thermo cracks are required.

In one aspect of the invention there is provided a cutting tool insert comprising a cemented carbide substrate and a coating wherein the substrate comprises from about 5 to about 7 wt-% Co, from about 140 to about 250 ppm Ti+Ta and balance WC with a weight ratio Ti/Ta of from about 0.8 to about 1.3, a coercivity, Hc, of from about 15.5 to about 19.5 kA/m, and a CW-ratio of from about 0.81 to about 0.95, and the coating comprises a homogeneous layer of $Al_xTi_{1-x}N$, with x=from about 0.5 to about 0.7 with a total thickness of from about 0.5 μm to about 15 μm, on the rake side and from about 2 μm to about 7 μm on the flank side.

In another aspect of the invention there is provided a method of making a cutting tool insert comprising a cemented carbide substrate and a coating comprising providing a substrate comprising from about 5 to about 7 wt-% Co, from about 140 to about 250 ppm Ti+Ta and balance WC with a weight ratio Ti/Ta of from about 0.8 to about 1.3, with a coercivity, Hc, of from about 15.5 to about 19.5 kA/m, and a CW-ratio of from about 0.81 to about 0.95 and depositing onto said substrate a coating comprising a homogeneous layer of, $Al_xTi_{1-x}N$, with x=from about 0.5 to about 0.7, the total thickness of the coating of from about 0.5 μm to about 15 μm on the rake side and from about 2 to about 7 μm on the flank side using cathodic arc evaporation using two or three pairs of arc sources consisting of pure Ti and/or TiAl alloy(s), in an $N_2$ or mixed $N_2$+Ar gas atmosphere.

Another aspect of the invention provides the use of a cutting tool insert as described above in milling of cast iron, grey cast iron, compact graphite iron or nodular iron, in both wet and dry conditions and with the following cutting data at Vc = from about 100 to about 400 m/min and fz=from about 0.05 to about 0.4 mm/tooth.

DETAILED DESCRIPTION OF THE PREFERRED EMBODIMENTS

It has now surprisingly been found that cutting tool inserts showing improved properties with respect to the different wear types prevailing at the above mentioned cutting operations can be obtained with cutting tool inserts comprising: a cemented carbide body with a W-alloyed binder phase and with a well balanced chemical composition and a certain grain size of the WC, in combination with a PVD-coated (Al,Ti)N-layer with a specific ratio between Al and Ti.

According to the present invention a coated cutting tool insert is provided of a cemented carbide body and a coating.

The cemented carbide body has a composition of from about 5 to about 7, preferably from about 5.5 to about 6.5, most preferably from about 5.8 to about 6.2 wt-% Co, from about 140 to about 250, preferably from about 160 to about 225, most preferably from about 175 to about 200 ppm Ti+Ta and balance WC. The weight ratio Ti/Ta is from about 0.8 to about 1.3, preferably from about 0.9 to about 1.2. The cemented carbide body may also contain smaller amounts of other elements, but on a level corresponding to a technical impurity. The coercivity, Hc, is from about 15.5 to about 19.5 kA/m, preferably from about 17.0 to about 18.7 kA/m.

The cobalt binder phase is alloyed with a certain amount of W giving the cemented carbide cutting insert its desired properties. W in the binder phase influences the magnetic properties of cobalt and can hence be related to a value CW-ratio, defined as CW-ratio=magnetic-% Co/wt-% Co where magnetic-% Co is the weight percentage of magnetic Co and wt-% Co is the weight percentage of Co in the cemented carbide.

The CW-ratio can vary between 1 and about 0.75 dependent on the degree of alloying. A lower CW-ratio corresponds to higher W contents and CW-ratio=1 corresponds practically to an absence of W in the binder phase.

According to the present invention, the improved cutting performance is achieved if the cemented carbide body has a CW-ratio of from about 0.81 to about 0.95, preferably within from about 0.85 to about 0.92, and most preferably within from about 0.86 to about 0.89. The cemented carbide may also contain small amounts, less than about 1 volume %, of η-phase ($M_6C$), without any detrimental effects. No free graphite should be present in the cemented carbide body according to the present invention.

The insert according to the present invention is provided with an (Al,Ti)N-layer, from about 0.5 to about 15 μm, preferably from about 1 to about 10 μm, more preferably from about 1 to about 5 μm, thick on the rake face and from about 2 to about 7 μm on the flank face. The stoichiometry of the whole layer as measured by, e.g., microprobe or EDS, including optional inner bonding layers and outer coloring layers, is $Al_xTi_{1-x}N$, where x is from about 0.5 to about 0.7, preferably from about 0.6 to about 0.7. In a preferred embodiment, there is an outer $Ti_bAl_{1-b}N$ layer, b=from about 0.8 to about 0.9, preferably from about 0.82 to about 0.85, of sufficient thickness to give a visible, homogenous bronze-colored look, preferably from about 0.1 to about 1 μm thick.

The present invention also relates to a method of making a cutting insert by powder metallurgical technique including wet milling of powders forming hard constituents and binder phase, compacting the milled mixture to bodies of desired shape and size and sintering. According to the method, a substrate is provided comprising from about 5 to about 7, preferably from about 5.5 to about 6.5, most preferably from about 5.8 to about 6.2 wt-% Co, from about 140 to about 250, preferably from about 160 to about 225, most preferably from about 175 to about 200 ppm Ti+Ta and balance WC. The weight ratio Ti/Ta is from about 0.8 to about 1.3, preferably from about 0.9 to about 1.2. The manufacturing conditions are chosen to obtain an as-sintered structure with the coercivity, Hc, from about 15.5 to about 19.5 kA/m, preferably from about 17.0 to about 18.7 kA/m and a CW-ratio defined as above from about 0.81 to about 0.95, preferably from about 0.85 to about 0.92, and most preferably from about 0.86 to about 0.89. The cemented carbide body may also contain smaller amounts of other elements, but on a level corresponding to a technical impurity.

Onto this substrate is deposited a coating comprising a homogeneous $Al_xTi_{1-x}N$ layer, with x=from about 0.5 to about 0.7, preferably from about 0.6 to about 0.7, with a total thickness of from about 0.5 to about 15 μm, preferably from about 1 to about 10 μm, most preferably from about 1 to about 5 μm on the rake face and from about 2 to about 7 μm on the flank face. The layer is deposited using cathodic arc evaporation using two or three pairs of arc sources consisting of pure Ti and/or TiAl alloy(s) in an $N_2$ or mixed $N_2$+Ar gas atmosphere. In a preferred embodiment an outer $Ti_bAl_{1-b}N$ layer, b=from about 0.8 to about 0.9, preferably from about 0.82 to about 0.85, of sufficient thickness to give a visible, homogenous bronze-colored look, preferably from about 0.1 to about 1 μm thick, is deposited.

The present invention also relates to the use of a cutting tool insert according to above in milling of grey cast iron, nodular cast iron, austempered ductile iron and compacted graphite iron, in both wet and dry conditions with the following cutting data at Vc=from about 100 to about 400 m/min and fz=from about 0.05 to about 0.4 mm/tooth.

The invention is additionally illustrated in connection with the following examples, which are to be considered as illustrative of the present invention. It should be understood, however, that the invention is not limited to the specific details of the examples.

EXAMPLE 1

Invention

Cemented carbide milling blanks were pressed in the following styles R390-170408M-KM, R290-12T308M-KM, R245-12T3M-KH, R245-12T3E-KL and R300-1648M-KH from a powder having a composition of 6.0 wt-% Co, 190 ppm Ti+Ta and with a Ti/Ta-ratio (by weight) of 1.06 and balance WC and sintered with normal technique at 1410° C. giving as-sintered inserts with a Hc value of 18.1 kA/m corresponding to an average WC grain size of 1.7 μm and a magnetic Co-content of 5.3 wt-% corresponding to a CW-ratio of 0.88 as measured in the FÖRSTER KOERZIMAT CS 1.096 from Foerster Instruments Inc. The inserts were edge rounded using conventional methods to a radius of 35 μm and then coated as follows:

A (Ti,Al)N-layer was deposited by cathodic arc evaporation. The layer was deposited from $Ti_{33}Al_{67}$-targets, with the inserts mounted on a 3-fold rotating substrate table. The arc evaporation was performed in an $N_2$-atmosphere. The total layer thickness was 3.3 μm on the rake phase within a distance of 0.3 mm from the edge line and 4.2 μm on the clearance side of the insert. The inserts were coated with a final outer layer of a $Ti_{0.84}Al_{0.16}N$ with a thickness of 0.2 μm to produce a bronze color.

EXAMPLE 2

Reference

Cemented carbide milling inserts with compositions as shown in Table 1, were produced according to known technique or were bought from competitors well-known in the market.

TABLE 1

| Variant | Substrate composition, weight % | | | | | Hc, kA/m | CW-ratio | Coating type and thickness, μm |
| --- | --- | --- | --- | --- | --- | --- | --- | --- |
| | Co | Ti | Ta | Nb | Cr | | | |
| Ref A | 9.2 | <0.005 | 1.2 | 0.3 | <0.005 | 12.5 | 0.92 | CVD 5.5 TiCN, 4.0 α-Al$_2$O$_3$ |
| Ref B | 7.6 | <0.005 | 1.1 | 0.25 | <0.005 | 14.8 | 0.91 | CVD 2.5 TiCN, 1.5 κ-Al$_2$O$_3$ |
| Ref C | 6.0 | <0.005 | <0.005 | <0.005 | <0.005 | 16.1 | 0.94 | CVD 5.5 TiCN, 4.0 α-Al$_2$O$_3$ |
| Ref D | 7.6 | <0.005 | 1.1 | 0.25 | <0.005 | 14.8 | 0.91 | PVD 3.4/4.4 *) TiAlN; Ti/Al = 1.8 |
| Comp1 | 8.1 | <0.005 | 0.9 | 0.4 | <0.005 | 15.2 | 0.89 | PVD 3.0/3.8 *) TiAlN Ti/Al = 0.55 |
| Comp2 | 10.1 | <0.005 | <0.005 | <0.005 | 0.55 | 19.8 | 0.75 | PVD 1.6/2.7 *) TiAlN; Ti/Al = 1.22 |
| Comp3 | 6.1 | <0.005 | <0.005 | <0.005 | 0.4 | 17.5 | 0.79 | PVD 1.8/2.2 *) TiAlN; Ti/Al = 1.14 |

*) Rake/flank side

Explanations to Examples 3-10

The following expressions/terms are commonly used in metal cutting, and explained in the table below:

| | |
| --- | --- |
| V$_c$ (m/min): | cutting speed in meters per minute |
| f$_z$ (mm/tooth): | feedrate in millimeter per tooth |
| z (number) | number of inserts in the cutter |
| a$_e$ (mm): | radial depth of cut in millimeter |
| a$_p$ (mm): | axial depth of cut in millimeter |
| D (mm): | cutter diameter in millimeter |

EXAMPLE 3

Inserts according to the invention from Example 1 were tested and compared to Reference A as well as a commercially available competitor's grade intended for the same application, Comp1. The insert according to the invention and reference A had the geometry R390-170408M-KM and the insert Comp1 had a similar geometry suitable for the same application area. All inserts were used in cutter with a diameter of 50 mm. The inserts were tested in a roughing face milling operation of a gear box in GCI (grey cast iron) with V$_c$=314 m/min, f$_z$=0.06-0.09 mm/tooth, a$_p$=4-5 mm, z=5 under wet conditions. The insert according to the invention lasted 158 minutes in this application, whereas Reference A lasted only 108 minutes and Comp1 intended for the same application lasted 100 min. The decisive type of wear type was chipping in the secondary cutting edge which leads to bad surface finish on the workpiece.

EXAMPLE 4

Inserts according to the invention from Example 1 were tested and compared to Reference B as well as a commercially available competitor's grade intended for the same application, Comp1. The insert according to the invention and reference B had the geometry R290-12T308M-KM and the insert Comp1 had a similar geometry suitable for the same application area. All inserts were used in a cutter with the diameter of 80 mm. The inserts were tested in finishing and semifinishing face milling operations of brake spiders in NCI (nodular cast iron, GGG40) in wet conditions. The clamping stability was bad. Cutting conditions were V$_c$=226 m/min, f$_z$=0.16 mm/tooth, z=8. Reference B lasted 170 minutes, Comp1 lasted 233 min and the insert according to the invention lasted 403 min. The decisive type of wear type for reference B was chipping in the cutting edge due to comb cracks and for Comp1 a big irregular flank wear, >0.5 mm, while the insert according to the invention got a more even flank wear without any chipping. The reasons for tool change were bad surface finish and/or burr on the workpiece.

EXAMPLE 5

Inserts from Example 1 were compared to reference A of geometry R300-1648M-KH. The operation was a roughing face milling of pump bodies in NCI (nodular cast iron) with a cutter with a diameter of 63 mm. The cutting data were V$_c$=316 m/min, z=6, f$_z$=0.32 mm/tooth, a$_p$=2 mm, a$_e$=60 mm, with coolant. After 28 min the insert reference A was worn out due to flaking of the coating and subsequent chipping in the edge line, whereas hardly any wear could be detected on the insert according to the invention from Example 1.

EXAMPLE 6

Inserts from Example 1 were compared to references B and C all of the same geometry, R245-12T3M-KH, and also to a commercially available competitors grade intended for the same application area, Comp2, with a similar geometry. The inserts were tested in a semifinishing face milling operation in a motor house of grey cast iron (GCI) under wet conditions with a cutter diameter of 125 mm. Cutting conditions were: V$_c$=392 m/min, z=6, f$_z$=0.10 mm/tooth, a$_p$=4.5 mm and a$_e$=67 mm. Reference B lasted 354 min, reference C 111 min, Comp2 335 min and the inserts according to the invention from Example 1 lasted 422 min. The wear type of reference B, Comp2 and inserts from Example 1 was flank wear, while reference C got flaking of the coating and chipping in the edge line. The reasons for tool change were chipping and/or bad surface finish on the workpiece, which occurred when the flank wear exceeded about 0.4 mm.

EXAMPLE 7

Inserts from Example 1 were compared to a competitor grade Comp3 intended for the same application area. The inserts were tested in a finishing face milling operation in valve bodies of NCI (SS0727) under dry conditions with V$_c$=251 m/min, z=8, f$_z$=0.125 mm/tooth, a$_p$=0.3 mm, a$_e$=60-65 mm with a cutter with diameter 80 mm. The geometry was R245-12T3E-KL. Insert from Example 1 according to the invention made 370 and 400 parts in two runs, while insert Comp3 only made 200 parts in average. The wear type was for both variants flank wear and the reason for tool change was bad surface finish.

EXAMPLE 8

Inserts from Example 1 with geometry R290-12T308M-KM were compared to reference B in the same geometry. The inserts were tested in a roughing face milling operation in valve bodies of NCI (SS0727) under dry conditions with $V_c$=196 m/min, z=5, $f_z$=0.16 mm/tooth, $a_e$=45 mm, $a_p$=2.5 mm in a cutter with diameter 50 mm. Both variants made 100 parts and the flank wear was measured to be 0.38 mm for reference B and 0.15 mm for the inserts according to the invention (Example 1).

EXAMPLE 9

Inserts from Example 1 with geometry R290-12T308M-KM were compared to reference A, B and D in the same geometry. The inserts were tested in a roughing face milling operation in a special part of compacted graphite iron (CGI), suitable for laboratory testing. The test was done under dry conditions with $V_c$=300 m/min, z=6, $f_z$=0.15 mm/tooth, $a_e$=50 mm, $a_p$=3 mm in a cutter with diameter 80 mm. Tool life criteria were even flank wear larger than 0.3 mm, chipping or uneven flank wear larger than 0.4 mm.

The tool life for the references A, B and D were 13, 17, and 18 min, respectively, compared to 22 min for the insert according to the invention.

EXAMPLE 10

Inserts from Example 1 with geometry R245-12T3M-KM were compared to reference A and B in the same geometry. The inserts were tested in a roughing face milling operation in a cylindrical bar of austempered ductile iron (ADI 800) with a diameter of 92 mm, suitable for laboratory testing. The test was done under dry conditions with $V_c$=160 m/min, z=2, $f_z$=0.30 mm/tooth, $a_p$=3.5 mm, $a_e$=45 mm in a cutter with diameter 63 mm. Tool life criterium was risk of insert break down due to chipping or big flank wear.

The tool life of the references A and B were 3.3 and 1.7 min, respectively, compared to 14.2 min for the insert according to the invention.

From Examples 3-10 it is evident that the insert according to the invention shows much better cutting performance than inserts according to prior art. The main advantages are better resistance against chipping due to less comb cracks and better flank wear resistance.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. Cutting tool insert comprising a cemented carbide substrate and a coating wherein:
   the substrate comprises from about 5 to about 7 wt-% Co, from about 140 to about 250 ppm Ti+Ta and balance WC with a weight ratio Ti/Ta of from about 0.8 to about 1.3, a coercivity, Hc, of from about 15.5 to about 19.5 kA/m, and a CW-ratio of from about 0.81 to about 0.95, and
   the coating comprises a homogeneous layer of $Al_xTi_{1-x}N$, with x = from about 0.5 to about 0.7 with a total thickness of from about 0.5 μm to about 15 μm, on the rake side and from about 2 μm to about 7 μm on the flank side.

2. A cutting tool insert of claim 1 wherein an outer $Ti_bAl_{1-b}N$ layer with b = from about 0.8 to about 0.9 and of sufficient thickness to give a visible, homogenous bronze-colored look.

3. A cutting tool insert of claim 1 wherein said substrate comprises from about 5.5 to about 6.5 wt-% Co, from about 160 to about 225 ppm Ti+Ta, a weight ratio Ti/Ta of from about 0.9 to about 1.2, a coercivity of from about 17.0 to about 18.7 kA/m and a CW-ratio of from about 0.85 to about 0.92.

4. A cutting tool insert of claim 3 wherein said substrates comprises from about 5.8 to about 6.2 wt-% Co and from about 175 to about 200 ppm Ti+Ta.

5. A cutting tool insert of claim 1 wherein said coating comprises a homogeneous layer of $Al_xTi_{1-x}N$, where x is from about 0.6 to about 0.7 and having a thickness of from about 1 to about 10 μm on the rake side.

6. A cutting tool insert of claim 5 wherein said layer has a thickness of from about 1 to about 5 μm on the rake face.

7. A cutting tool insert of claim 2 wherein in said outer $Ti_bAl_{1-b}N$ layer, b is from about 0.82 to about 0.85 and said layer is from about 0.1 to about 1 μm thick.

8. Method of making a cutting tool insert comprising a cemented carbide substrate and a coating comprising providing a substrate comprising from about 5 to about 7 wt-% Co, from about 140 to about 250 ppm Ti+Ta and balance WC with a weight ratio Ti/Ta of from about 0.8 to about 1.3, with a coercivity, Hc, of from about 15.5 to about 19.5kA/m, and a CW-ratio of from about 0.81 to about 0.95 and depositing onto said substrate a coating comprising a homogeneous layer of, $Al_xTi_{1-x}N$, with x = from about 0.5 to about 0.7, the total thickness of the coating of from about 0.5 μm to about 15 μm on the rake side and from about 2 to about 7 μm on the flank side using cathodic arc evaporation using two or three pairs of arc sources consisting of pure Ti and/or TiAl alloy(s), in an $N_2$ or mixed $N_2$+Ar gas atmosphere.

9. A method of claim 8 depositing an outer $Ti_bAl_{1-b}N$ layer, b = from about 0.8 to about 0.9 and of sufficient thickness to give a visible, homogenous bronze-colored look.

10. A method of claim 8 wherein said substrate comprises from about 5.5 to about 6.5 wt-% Co, from about 160 to about 225 ppm Ti+Ta, a weight ratio Ti/Ta of from about 0.9 to about 1.2, a coercivity of from about 17.0 to about 18.7 kA/m and a CW-ratio of from about 0.85 to about 0.92.

11. A method of claim 8 wherein said substrates comprises from about 5.8 to about 6.2 wt-% Co and from about 175 to about 200 ppm Ti+Ta.

12. A method of claim 8 wherein said coating comprises a homogeneous layer of $Al_xTi_{1-x}N$, where x is from about 0.6 to about 0.7 and having a thickness of from about 1 to about 10 μm on the rake side.

13. A method of claim 8 wherein said layer has a thickness of from about 1 to about 5 μm on the rake face.

14. A method of claim 8 wherein in said outer $Ti_bAl_{1-b}N$ layer, b is from about 0.82 to about 0.85 and said layer is from about 0.1 to about 1 μm thick.

15. A process of using a cutting tool insert, comprising milling cast iron, grey cast iron, compact graphite iron or nodular iron, in both wet and dry conditions and with the following cutting data at Vc = from about 100 to about 400 m/min and fz = from about 0.05 to about 0.4 mm/tooth with the cutting tool insert of claim 1.

* * * * *